US012638622B2

(12) United States Patent
Aho et al.

(10) Patent No.: US 12,638,622 B2
(45) Date of Patent: May 26, 2026

(54) SYSTEM AND METHOD FOR FABRICATING HIGH-ASPECT-RATIO GRATINGS

(71) Applicant: Modulight Corporation, Tampere (FI)

(72) Inventors: Timo Aho, Tampere (FI); Mika Mähönen, Tampere (FI)

(73) Assignee: Modulight Corporation, Tampere (FI)

(*) Notice: Subject to any disclaimer, the term of this patent is extended or adjusted under 35 U.S.C. 154(b) by 207 days.

(21) Appl. No.: 18/456,650

(22) Filed: Aug. 28, 2023

(65) Prior Publication Data

US 2025/0076550 A1     Mar. 6, 2025

(51) Int. Cl.
| | |
|---|---|
| *C23C 16/04* | (2006.01) |
| *C23C 16/34* | (2006.01) |
| *C23C 16/40* | (2006.01) |
| *C23C 16/50* | (2006.01) |
| *C23C 16/56* | (2006.01) |
| *G02B 1/02* | (2006.01) |
| *G02B 5/18* | (2006.01) |

(52) U.S. Cl.
CPC .......... *G02B 5/1857* (2013.01); *C23C 16/042* (2013.01); *C23C 16/345* (2013.01); *C23C 16/402* (2013.01); *C23C 16/50* (2013.01); *C23C 16/56* (2013.01); *G02B 1/02* (2013.01)

(58) Field of Classification Search
None
See application file for complete search history.

(56) References Cited

U.S. PATENT DOCUMENTS

| | | |
|---|---|---|
| 2003/0129840 A1 | 7/2003 | Kumar et al. |
| 2008/0038660 A1 | 2/2008 | Doneda et al. |

| | | | |
|---|---|---|---|
| 2020/0355857 A1* | 11/2020 | Quack ................ | G02B 27/1073 |
| 2020/0409151 A1* | 12/2020 | Calafiore ........... | G02B 27/4272 |
| 2021/0313086 A1* | 10/2021 | Vogtmeier ........... | G02B 5/1857 |
| 2022/0344476 A1* | 10/2022 | Chan ..................... | H01S 5/0217 |
| 2024/0004111 A1* | 1/2024 | Sasaki ..................... | G02B 5/18 |

FOREIGN PATENT DOCUMENTS

| | | | | |
|---|---|---|---|---|
| DE | 102008044307 B4 * | 5/2019 | ......... | H01L 21/0475 |

OTHER PUBLICATIONS

European Patent Office, The International Search Report and the Written Opinion of the International Searching Authority, Application PCT/FI2024/050411, mailed Nov. 8, 2024, 14 pages.

* cited by examiner

*Primary Examiner* — Shamim Ahmed

(74) *Attorney, Agent, or Firm* — Ziegler IP Law Group, LLC.

(57) ABSTRACT

Disclosed is a method for fabricating high-aspect-ratio gratings that includes providing a semiconductor substrate. The method further includes depositing a first layer of a first silicon-based material on the semiconductor substrate; depositing a second layer of a second silicon-based material on the first layer; and depositing a third layer of a resist material on the second layer. The method further includes forming a pattern in the third layer by exposing the resist material. The method further includes transferring the pattern from the third layer into the second layer by etching; and transferring the pattern from the second layer into the first layer by etching, using the patterned second layer as a first mask layer. The method further includes forming a grating into the semiconductor substrate by etching, using the patterned first layer as a second mask layer.

15 Claims, 4 Drawing Sheets

100

208

206
204
202
200

208

206
204
202
200

208

204
202
200

208
210

204
202
200

210 — 200

400 — 204, 202

502    504    506

500

SYSTEM AND METHOD FOR FABRICATING HIGH-ASPECT-RATIO GRATINGS

TECHNICAL FIELD

The present disclosure relates to a method for fabricating high-aspect-ratio gratings. Moreover, the present disclosure relates to a system for fabricating high-aspect-ratio gratings. Furthermore, the present disclosure relates to a mask for use in fabrication of high-aspect-ratio gratings by Plasma Enhanced Chemical Vapor Deposition (PECVD) process.

BACKGROUND

Distributed Bragg Reflector (DBR) lasers are a class of lasers that are characterized by their ability to emit light at very specific, tunable wavelengths. This property is particularly valuable for many applications, including telecommunications, spectroscopy, and sensing. A key feature of DBR lasers that allow for this precision is the inclusion of surface gratings. Surface gratings in DBR lasers helps in producing narrow linewidth laser light. The surface gratings are intricate structures characterized by small openings and high aspect ratios. The term "high aspect ratio" in this context refers to the ratio of the depth to the width of the grating trenches. In DBR lasers, the surface gratings with such high aspect ratio have small openings (~20-100 nm) and the required etching depth is in the range of micrometers. This complex geometric feature poses significant challenges to the fabrication process, as the gratings must be produced with precise dimensions and high fidelity to ensure the desired laser properties.

Traditionally, the fabrication of these gratings employs etching masks made of silicon dioxide ($SiO_2$). The etching mask serves as a template that guides the etching process, ensuring the correct pattern is transferred onto the semiconductor substrate. However, the small opening size and high aspect ratio of the gratings impose stringent requirements on the $SiO_2$ mask. In particular, it is challenging to use a thick $SiO_2$ layer that would be robust enough to endure the prolonged etching process needed to create the deep structures inherent to high-aspect-ratio gratings. Furthermore, a commonly used method for growing $SiO_2$ masks, known as Plasma Enhanced Chemical Vapor Deposition (PECVD), tends to produce masks with a rough surface. This roughness is seen in the rough edges of the openings, and can be transferred onto the grating structures during the etching process, leading to gratings with rough edges. The presence of such roughness can impact the quality and performance of the fabricated gratings and consequently, the DBR lasers.

Therefore, in light of the foregoing discussion, there exists a need to overcome the aforementioned limitations/drawbacks.

SUMMARY

The aim of the present disclosure is to provide a method, a system and a mask that allow for the creation of deeper etchings, increased durability of the mask during the etching process, and smoother edges in the grating openings, which enhance the performance of the DBR laser. The aim of the present disclosure is achieved by a method and a system for, and a mask for use in, fabrication of high-aspect-ratio gratings as defined in the appended independent claims to which reference is made to. Advantageous features are set out in the appended dependent claims.

Throughout the description and claims of this specification, the words "comprise", "include", "have", and "contain" and variations of these words, for example "comprising" and "comprises", mean "including but not limited to", and do not exclude other components, items, integers, or steps not explicitly disclosed also to be present. Moreover, the singular encompasses the plural unless the context otherwise requires. In particular, where the indefinite article is used, the specification is to be understood as contemplating plurality as well as singularity, unless the context requires otherwise.

DETAILED DESCRIPTION OF EMBODIMENTS

Figure 1:
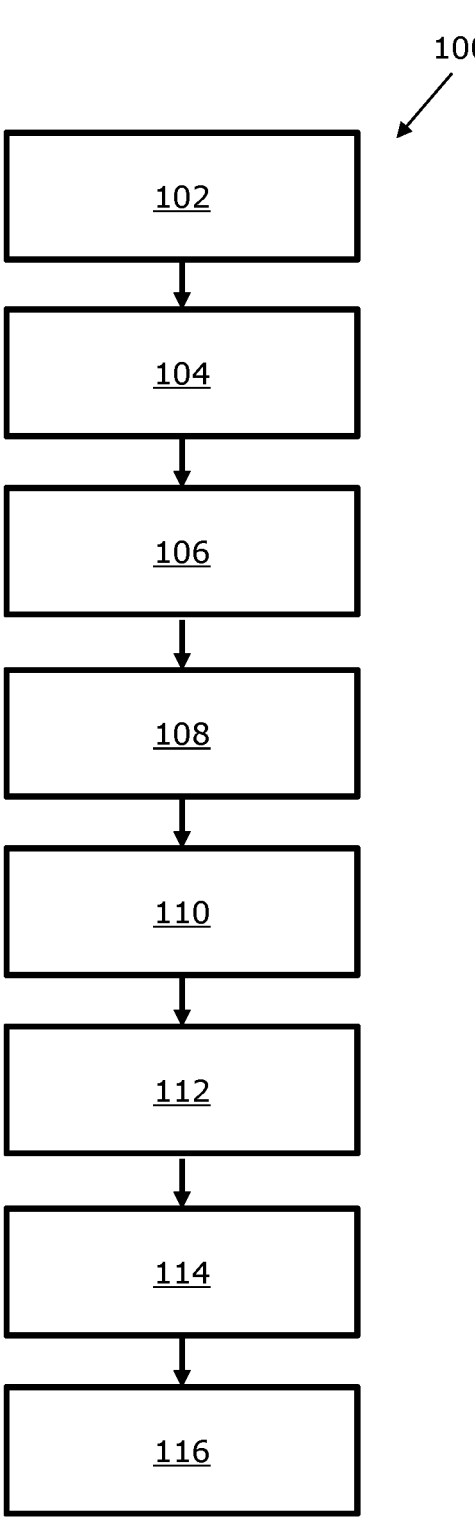
FIG. 1 is an illustration of a flowchart listing steps involved in a method for fabricating high-aspect-ratio gratings, in accordance with one or more embodiments of the present disclosure.

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, the present disclosure provides method for fabricating high-aspect-ratio gratings, the method comprising:

providing a semiconductor substrate;

depositing a first layer of a first silicon-based material on the semiconductor substrate;

depositing a second layer of a second silicon-based material on the first layer;

depositing a third layer of a resist material on the second layer;

forming a pattern in the third layer by exposing the resist material;

transferring the pattern from the third layer into the second layer by etching;

transferring the pattern from the second layer into the first layer by etching, using the patterned second layer as a first mask layer; and forming a grating into the semiconductor substrate by etching, using the patterned first layer as a second mask layer.

The present method provides sequential deposition of the first layer of the first silicon-based on the semiconductor substrate and the second layer of the second silicon-based material thereon, forming a dual-layer mask for etching.

This dual-layer mask ensures enhanced durability during the prolonged etching process, as required for forming high-aspect-ratio grating structures. The application of the resist layer, which is patterned through exposure, ensures that intricate designs may be effectively formed on the mask. The method employs different etching processes to transfer the pattern first into the second layer and then into the first layer, each time using the previously patterned layer as a mask. This step-wise transfer of patterns allows for the accurate translation of complex and high-resolution designs from the resist layer onto the semiconductor substrate.

In a second aspect, the present disclosure provides a system for fabricating high-aspect-ratio gratings, the system comprising:

a deposition unit configured to:

deposit a first layer of a first silicon-based material on a semiconductor substrate;

deposit a second layer of a second silicon-based material on the first layer; and deposit a third layer of a resist material on the second layer;

a patterning unit configured to form a pattern in the third layer by exposing the resist material; and an etching unit configured to:

transfer the pattern from the third layer into the second layer by etching;

transfer the pattern from the second layer into the first layer by etching, using the patterned second layer as a first mask layer; and form a grating into the semiconductor substrate by etching, using the patterned first layer as a second mask layer.

The system is designed to facilitate the fabrication of high-aspect-ratio gratings by incorporates the deposition unit, the patterning unit, and the etching unit, each serving a distinct role in the process of fabrication. The modular nature of the system allows for the seamless integration of the deposition, patterning, and etching processes, and thus reduces the potential for errors that may occur during the transfer of substrates between separate, stand-alone systems. Further by having dedicated units for each process, the system ensures the optimum conditions for each stage.

In a third aspect, the present disclosure provides a mask for use in fabrication of high-aspect-ratio gratings by Plasma Enhanced Chemical Vapor Deposition (PECVD) process, the mask comprising:

a first mask layer of a first silicon-based material adapted to be deposited as a first layer on a semiconductor substrate; and a second mask layer of a second silicon-based material adapted to be deposited as a second layer on the first mask layer, wherein, in the PECVD process, a pattern formed on a third layer of a resist material as deposited on the second layer, is first transferred into the second layer and then into the first layer, to subsequently form a grating into the semiconductor substrate using the patterned first mask layer and the patterned second mask layer.

Herein, the use of a two-layer structure (also referred to as "dual-layer mask"), with the first silicon-based material and the second silicon-based material, provides a high-resolution mask capable of surviving the intensive etching process, which is required for fabricating gratings with high aspect ratios. The two-layer structure also allows for enhanced control over the pattern transfer, facilitating the fabrication of precise grating structures. Further, since each of the silicon-based mask layers can be individually tailored and optimized based on the specifics of the resist material and the desired etching depth, the mask can be customized to the requirements of each individual grating design.

The method comprises providing the semiconductor substrate, to be used as a template for the deposited layers, and eventually, the gratings etched into it to form the active region of the DBR laser or other devices. In other words, the semiconductor substrate forms the base on which the grating structure is created. Semiconductor materials are chosen for their specific properties, namely, their ability to control the flow of current. These substrates are typically composed of materials like silicon, germanium, or gallium arsenide, among others. The semiconductor substrate is typically in the form of a wafer, like a thin slice of semiconductor material. These wafers are cut from a single crystal (also known as a boule) of semiconductor material and then polished to achieve a smooth surface. This ensures that the fabricated structures will have a high-quality, uniform base to build upon.

The method further comprises depositing the first layer of the first silicon-based material on the semiconductor substrate, to serve as the base of the dual-layer mask that may be utilized in the etching process to form the grating. The deposition of the first silicon-based material layer is achieved via a process like Chemical Vapor Deposition (CVD) or Plasma Enhanced Chemical Vapor Deposition (PECVD). These deposition techniques are selected for their ability to create thin, uniform, and high-quality layers of materials onto substrates, even at lower temperatures. The use of such deposition techniques ensures that the material properties of the semiconductor substrate are preserved during the deposition process. Further, a thickness of the first layer is finely tuned and optimized based on several factors, including the type of silicon-based material used, the specific requirements of the grating to be fabricated, and the constraints of the subsequent etching process. It may be appreciated that the composition of the first silicon-based material in the first layer may vary depending on the requirements of the specific process or device, as discussed in more detail later in the description.

The method further comprises depositing the second layer of the second silicon-based material on the first layer. That is, upon the completion of the first layer deposition, the second layer of a different silicon-based material is deposited on top of the first layer, which forms the second layer of the mask. The second silicon-based material is selected such that it possesses desirable characteristics that complement the first silicon-based material including, but not limited to, improved etch resistance, etc. Deposition of the second layer involves processes similar to those used for the first layer, like Chemical Vapor Deposition (CVD) or Plasma Enhanced Chemical Vapor Deposition (PECVD). These techniques allow for the precise and uniform deposition of the silicon-based material onto the first layer. A thickness of the second layer is optimized in accordance with factors like the requirements of the gratings to be fabricated, the particular etching process to be used, and the characteristics of the resist material that is subsequently applied.

In an embodiment, the first silicon-based material is silicon nitride ($SiN_x$) and the second silicon-based material is silicon dioxide ($SiO_2$). Silicon nitride is selected for the first layer due to its particular properties that make it advantageous for the process of grating fabrication, such as its good etch resistance, high chemical stability, and high mechanical strength, enabling it to withstand the vigorous etching process that is necessary for the formation of highaspect-ratio gratings. Moreover, silicon nitride provides an appropriate surface upon which the silicon dioxide layer can subsequently be deposited, by ensuring an excellent adherence of the second layer, thereby enhancing the overall structural integrity of the dual-layer mask. Silicon dioxide is chosen as the second layer due to its characteristics that complement those of the silicon nitride layer. Notably, silicon dioxide has a smoother surface finish, which improves the precision of the pattern transferred from the resist material (as discussed later in more detail). Silicon dioxide also has a good etching resistance, but distinct enough from silicon nitride to allow for a controlled, differential etching process that can effectively form the desired pattern in the dual-layer mask. Thus, the selection of silicon nitride as the first silicon-based material and silicon dioxide as the second silicon-based material serves to optimize the properties of each layer in the dual-layer mask. This enables a highly efficient, precise, and adaptable process for the fabrication of high-aspect-ratio gratings.

In an alternate embodiment, the first silicon-based material is silicon dioxide ($SiO_2$) and the second silicon-based material is silicon nitride ($SiN_x$). This inverted arrangement of materials involves depositing a layer of silicon dioxide directly onto the semiconductor substrate first, followed by a layer of silicon nitride. Silicon dioxide may be a good material choice for the initial deposition layer due to its good thermal stability, compatibility with silicon substrates, and ease of deposition via PECVD.

Moreover, insulating properties of silicon dioxide may also be considered in device applications where electrical insulation is needed between the substrate and the subsequent layers. Further, silicon nitride for the second layer may be utilized due to its robust characteristics, including chemical inertness, high density, superior barrier properties, hardness and resistance to etching. This inverted arrangement may prove beneficial in certain circumstances where the properties of silicon dioxide serve as an advantage when in direct contact with the semiconductor substrate, or the superior etch resistance of silicon nitride is leveraged as the second layer for pattern transfer (as discussed in the subsequent paragraphs).

The method further comprises depositing the third layer of the resist material on the second layer. That step involves, after the deposition of the first and second silicon-based material layers, depositing the third layer of the resist material onto the second layer. A resist, in the context of semiconductor fabrication, is a thin layer used to transfer a designed pattern to the semiconductor substrate. The resist material, which is sensitive to radiation (like electron beam or light), is used to protect the areas of the semiconductor that are not to be etched. In an example, the resist material is deposited by a process called spin-coating. In spin-coating, the resist material is dispensed onto the center of the substrate (herein, the second layer), which is then rapidly spun to spread the material evenly across the surface, creating a uniform layer. The thickness of the resist layer can be controlled by adjusting the spin speed and the resist's viscosity. In some examples, after the resist layer has been applied, it is usually baked to remove any remaining solvent, thereby hardening the resist and improving its adhesion to the second layer, as may be required to withstand subsequent etching processes.

In an embodiment, the resist material is an electron-beam resist material. In the present method, the electron-beam (e-beam) resist material is used as it allows for extremely high-resolution patterning, as required for fabricating high-aspect-ratio gratings. E-beam, or electron beam lithography, is a technique for creating extremely fine patterns (down to the nanometer level) required by the modern semiconductor industry for integrated circuits. The resist material in this case is designed to change its chemical structure when exposed to a focused beam of electrons. Commonly used e-beam resist material include PMMA (polymethyl methacrylate), ZEP (Zeon's positive-tone resist), and HSQ (hydrogen silsesquioxane), each having specific properties suited to different applications. PMMA, for example, is often used as a positive resist, which means areas of the PMMA resist exposed to the e-beam become more soluble in a developer solution and can be selectively removed to leave behind the desired pattern. ZEP is another positive-tone resist but it has higher contrast and resolution compared to PMMA, and is typically used for more precise or smaller feature size applications. HSQ, on the other hand, is used as a negative tone resist, meaning the areas exposed to the e-beam become less soluble and remain after development, while the unexposed areas are washed away, and can yield extremely high resolution and is often used when ultra-small feature sizes are required. The use of the e-beam resist material for the present method allows for precise patterning down to the nanometer scale. This level of detail is key in fabricating high-aspect-ratio gratings, which require exact patterning to function effectively.

The method further comprises forming the pattern in the third layer by exposing the resist material. This process involves using a focused beam of electrons to induce chemical changes in the third layer of the resist material, which allow the formation of a specific pattern. Exposure of the resist material can be achieved through techniques like electron beam lithography (EBL), which is well-suited for producing fine patterns down to the nanoscale. In EBL, a tightly focused beam of electrons is scanned across the third layer as per the required specifications of the grating to be fabricated. The precise control over the beam's movement enables the creation of the pattern on the third layer. It may be understood that wherever the electron beam strikes the resist material, it causes the resist material to change its solubility to the developer solution. For a positive resist, exposure to the electron beam increases solubility of the resist material, while for a negative resist material, the exposed areas become less soluble. Further, post exposure, the substrate (i.e. the third layer) is developed, meaning it is immersed in a special solution that selectively removes the more soluble areas of the resist material, effectively revealing the pattern. This pattern can then be transferred to the underlying silicon-based material layers through etching, allowing for the creation of high-aspect-ratio gratings with precise control over their geometry (as discussed in the subsequent paragraphs).

The method further comprises transferring the pattern from the third layer into the second layer by etching. Etching is a process in microfabrication used to remove layers from the surface of a substrate during manufacturing. In this case, transferring the pattern from the third layer (the resist material) into the second layer (the second silicon-based material) by etching is used to precisely replicate the pattern formed in the third layer onto the second layer. In some examples, this may require the etching process to be highly anisotropic, meaning it removes material primarily in one direction (vertically down into the substrate) and not laterally (sideways across the surface of the substrate). Anisotropic etching is particularly important when creating high-aspect-ratio structures, as it ensures the walls of the structures are straight and the dimensions of the pattern are accurately preserved. In present examples, the etching process may be carried out using either wet chemical processes or dry etching such as Reactive Ion Etching (RIE) or Deep Reactive Ion Etching (DRIE). These techniques use chemically reactive gases or liquids to remove the exposed areas of the second layer that are not protected by the resist material. The etching process synergizes with the previous step of pattern formation to produce a patterned second layer that serves as the first mask layer for the subsequent etching of the first layer and the semiconductor substrate, as discussed hereinafter.

The method further comprises transferring the pattern from the second layer into the first layer by etching, using the patterned second layer as the first mask layer. The etching process in this step mirrors the previous pattern transfer, but with the second layer acting as the first mask layer (i.e., etching mask). Herein, the said first mask layer protects areas of the first layer underneath from being etched away, while the unprotected areas are removed in the etching process. In this way, the pattern created in the third layer and transferred into the second layer is further transferred into the first layer. As in the previous etching step, the process may need to be highly anisotropic to ensure the straightness of the grating walls and accurate replication of the pattern, as may be achieved using similar techniques, such as RIE or DRIE. The transfer of the pattern from the second layer to the first layer using etching synergizes with the preceding steps by ensuring that the pattern is accurately replicated at each stage. This step in the fabrication process, thereby, forms a patterned first layer, which serves as the second mask layer in the following etching process that forms the grating in the semiconductor substrate, as discussed further in the description.

It may be appreciated by a person skilled in the art that the choice of etching process and the precise parameters may depend on the specific silicon-based materials used in the first layer and second layer, and it may be necessary to fine-tune these parameters to achieve optimal results. Specifically, the effectiveness and precision of the etching process depend on the material's ability to be selectively removed from the corresponding layer, leaving behind the desired pattern. However, different silicon-based materials, such as silicon nitride or silicon dioxide, have different physical and chemical properties. These differences may affect their resistance to the etching process. For instance, silicon nitride and silicon dioxide have different etch rates in different etching environments. Silicon nitride typically has a lower etch rate compared to silicon dioxide in most wet etching solutions. However, in dry etching processes, like RIE, plasma parameters, gas composition, and the presence of passivation layers can drastically affect these rates.

In an embodiment, in which the first silicon-based material is silicon nitride and the second silicon-based material is silicon dioxide, transferring the pattern from the third layer into the second layer by etching involves Reactive Ion Etching (RIE) using trifluoromethane ($CHF_3$) in conjunction with argon (Ar), and transferring the pattern from the second layer into the first layer by etching involves RIE using trifluoromethane ($CHF_3$) in conjunction with oxygen ($O_2$). That is, for a first stage of etching of the second layer, trifluoromethane and argon are used as etching gases; and for a second stage of etching of the first layer, trifluoromethane and oxygen are used as etching gases. These specific choice of etching gases for these two stages of transferring the pattern from the third layer into the second layer and then from the second layer into the first layer involving RIE is related to the different etch rates of the first and second materials with their different plasma etching chemistries.

Specifically, herein the resist material, as the e-beam resist material, is an organic material typically prepared from polymers and its etch rate in a plasma containing oxygen is significantly higher compared to that in a plasma containing argon. As a result, if a plasma with oxygen component is used for the first stage, the e-beam resist material would be etched away too quickly, making it difficult to transfer the pattern accurately. Hence, trifluoromethane and argon based plasma is used for the first stage, which etches the e-beam resist layer at an optimal rate, thereby allowing for precise pattern transfer.

Subsequently, the pattern from the second layer (made of silicon dioxide) is transferred into the first layer (made of silicon nitride) using RIE with trifluoromethane and oxygen. The reason for this choice is that silicon nitride has a much higher etch rate in trifluoromethane and oxygen based plasma compared to silicon dioxide. This high selectivity enables the precise etching of silicon nitride without significantly affecting the top silicon dioxide layer. Moreover, due to the high etch rate of e-beam resist in trifluoromethane and oxygen based plasma, this plasma cannot be used to transfer the pattern from the resist layer into the first layer ($SiN_x$), as the resist layer may not survive the etching time.

Thus, a two-step process using two different plasmas, i.e., $CHF_3/Ar$ for the resist-to-$SiO_2$ transfer and $CHF_3/O_2$ for the $SiO_2$-to-$SiN_x$ transfer, is necessary to achieve the desired high-aspect-ratio gratings. Thereby, the present method leverages the distinct etching characteristics of different silicon-based materials in response to various plasma chemistries for creating the dual-layer mask. The chosen methodology takes advantage of these differences to enable precise and efficient pattern transfer across multiple layers. The created dual-layer mask may then be used for successful fabrication of high-aspect-ratio gratings (as discussed in the proceeding paragraphs).

The method further comprises forming the grating into the semiconductor substrate by etching, using the patterned first layer as a second mask layer. That is, the final step of the method involves the etching of the semiconductor substrate to form the desired grating structure. In this process, the patterned first layer, which may either be silicon dioxide or silicon nitride depending on the specific embodiment, serves as the second mask layer. The use of the patterned first layer as the second mask layer enables the pattern (i.e., grating pattern) to be precisely transferred into the semiconductor substrate. The etching process for the semiconductor substrate may employ various techniques, such as dry etching methods such as RIE or DRIE, which may deliver the high aspect ratios required for such grating structures. The specifics of the etching process, including the etching gas mixture, pressure, power, and etching time, may be adjusted depending on the specific semiconductor material used and the precise requirements of the grating structure, such as its depth and aspect ratio.

Specifically, this process employs the patterned first layer and the patterned second layer as the dual-layer mask, with the patterned first layer acting as the second mask layer and the patterned second layer acting as the first mask layer. The use of this dual-layer mask brings an additional level of control and precision to the process, enhancing the quality and characteristics of the formed grating. As the etching process proceeds, the second silicon-based material in the second layer, which was patterned using the third layer of resist material, is gradually etched away. This exposes the first silicon-based material in the patterned first layer, which then serves as the second mask layer, directing the continuation of the etching process into the semiconductor substrate. It may be appreciated that the first silicon-based material in the first layer and the second silicon-based material in the second layer have different etching characteristics. This difference enables the patterned second layer (the first mask layer) to offer high selectivity during the initial stages of the etching process, while the patterned first layer (the second mask layer) has the capacity to withstand the etching process for a longer duration. This ensures that the pattern is deeply and accurately transferred into the semiconductor substrate, forming the high-aspect-ratio grating.

The present disclosure also relates to the system for fabricating high-aspect-ratio gratings as described above. Various embodiments and variants disclosed above, with respect to the aforementioned method, apply mutatis mutandis to the system.

The system is an integrated suite of interconnected units, each with specific roles that cater to the individual steps involved in the fabrication process. Each unit is fine-tuned to provide exceptional precision and efficiency, contributing to the overall performance of the system.

The deposition unit is configured to sequentially deposit layers of silicon-based materials and resist material on the semiconductor substrate. The deposition unit may be implemented in controlled environment, which includes elements such as gas injectors, heat sources, and a chamber, to create the conditions for the deposition of uniform, high-quality layers of materials. Various deposition techniques such as Plasma Enhanced Chemical Vapor Deposition (PECVD) or Low-Pressure Chemical Vapor Deposition (LPCVD) may be utilized depending on the silicon-based materials being used. This flexibility in deposition techniques may be adapted to the specifics of the first and second silicon-based materials, ensuring the integrity of these layers for subsequent steps.

The patterning unit is configured to create patterns in the resist material by exposing the resist material through a process such as electron beam lithography or photolithography. The patterning unit includes components such as a highly precise electron beam or light source, a stage for the substrate, and a control system to guide the exposure according to the desired pattern. The patterning unit provides precise controls to allow for minute adjustments to exposure parameters, ensuring detailed and accurate pattern formation on the resist layer.

The etching unit is configured to transfer the pattern from the resist layer down to the semiconductor substrate to form the grating. The etching unit employs techniques such as RIE or DRIE, facilitated by a plasma generator, gas supply system, and temperature and pressure control systems. The etching unit enables precise control over etching conditions and the etching rate, allowing for the accurate transfer of patterns and formation of high-aspect-ratio gratings.

In an embodiment of the system, the first silicon-based material is silicon nitride ($SiN_x$) and the second silicon-based material is silicon dioxide ($SiO_2$).

In an embodiment of the system, the first silicon-based material is silicon dioxide ($SiO_2$) and the second silicon-based material is silicon nitride ($SiN_x$).

In an embodiment of the system, the resist material is an electron-beam resist material.

In an embodiment of the system, the etching unit is configured to:

transfer the pattern from the third layer into the second layer by Reactive Ion Etching (RIE) using trifluoromethane ($CHF_3$) in conjunction with argon (Ar); and transfer the pattern from the second layer into the first layer by etching involves RIE using trifluoromethane ($CHF_3$) in conjunction with oxygen ($O_2$).

The present disclosure also relates to the mask for use in fabrication of high-aspect-ratio gratings by Plasma a Enhanced Chemical Vapor Deposition (PECVD) process as described above. Various embodiments and variants disclosed above, with respect to the aforementioned method and the aforementioned system, apply mutatis mutandis to the mask.

The mask used in the fabrication of high-aspect-ratio gratings through the PECVD process comprises a first mask layer of the first silicon-based material and a second mask layer of the second silicon-based material. The first mask layer is specifically adapted to be deposited as the initial layer on the semiconductor substrate. The second mask layer, which is of a different silicon-based material, is deposited on top of the first mask layer. During the PECVD process, the resist layer is deposited and patterned on top of these mask layers. The pattern on the resist layer is then transferred into the second mask layer and then into the first mask layer. This two-stage pattern transfer process, facilitated by the two different silicon-based materials with distinct etching characteristics, allows for precise control over the pattern dimensions and ensures the high fidelity of the transferred pattern. Thus, the mask, with dual-layered structure of different silicon-based materials, helps in precise fabrication of high-aspect-ratio gratings.

In an embodiment of the mask, the first silicon-based material is silicon nitride ($SiN_x$) and the second silicon-based material is silicon dioxide ($SiO_2$).

In an embodiment of the mask, the first silicon-based material is silicon dioxide ($SiO_2$) and the second silicon-based material is silicon nitride ($SiN_x$).

In an embodiment of the mask, transferring the pattern from the third layer into the second mask layer involves Reactive Ion Etching (RIE) using trifluoromethane ($CHF_3$) in conjunction with argon (Ar).

In an embodiment of the mask, transferring the pattern from the second mask layer into the first mask layer involves Reactive Ion Etching (RIE) using trifluoromethane ($CHF_3$) in conjunction with oxygen ($O_2$).

The method, the system, and the mask of the present disclosure provide several significant advantages over existing solutions. The dual-layer approach of using two different silicon-based materials as mask layers allows for the fabrication of high-aspect-ratio gratings with a greater degree of precision and control. The distinct etching properties of the silicon-based materials used in the first and second mask layers can be used to ensure precise pattern transfer from the resist layer to the semiconductor substrate. The use of the e-beam resist material for patterning offers advantage in resolution and pattern accuracy. The e-beam lithography process allows for the fabrication of patterns with extremely fine details, as required for achieving high-aspect-ratio gratings. Further, the deposition process of the silicon-based layers by PECVD process ensures high uniformity and excellent layer adherence. This uniformity in layer thickness leads to greater control and consistency in the etching process, resulting in gratings of higher quality and performance.

In the present embodiments, the fabricated high-aspect-ratio grating may be integral to various optical and electronic components. For instance, in the case of a semiconductor laser, the grating may form part of an optical cavity. Herein, the high-aspect-ratio grating plays a role in wavelength locking, narrowing, or tuning. The superior control and precision provided by the present method enable the fabrication of gratings with the exact specifications needed for such precise wavelength manipulations. Similarly, the high-aspect-ratio grating may be an integral part of a semiconductor or insulator waveguide, such as Silicon-On-Insulator (SOI) or Planar Lightwave Circuit (PLC). In this case, the grating may be used for locking, narrowing, or tuning the wavelength, or even out-coupling the light of an external cavity laser. The ability to fabricate high-quality gratings, as proposed by the present method, enhance the performance and efficiency of these waveguide systems.

Beyond optical applications, the present method for high-aspect-ratio etching may be employed in the manufacturing of electronic components, such as transistors in integrated circuits (ICs). In such cases, the fine feature sizes and high aspect ratios achievable may be used for enhancing device performance and miniaturization, for advancing IC technology. In these varied applications, the present method of manufacturing high-aspect-ratio gratings brings substantial enhancements in precision, control, and versatility, underscoring its broad utility and value.

EXPERIMENTAL PART

The nature of the surfaces of the deposited layers is important in the process of fabricating high-aspect-ratio gratings. This importance arises from the fact that the surface roughness can affect the fidelity of the pattern transfer process from the resist layer to the silicon-based layers, thereby impacting the aspect ratios of the etched gratings. As known in the existing literature, a significant difference is observed in the surface roughness of PECVD grown silicon nitride ($SiN_x$) and silicon dioxide ($SiO_2$) layers. Root mean square (RMS) surface roughness value for $SiN_x$ layers grown using the PECVD process is reported to be 0.57 nm (according to the research conducted by Bucio, Thalía Domínguez, et al. published in the Journal of Physics D: Applied Physics, 2016, incorporated herein by reference in its entirety). On the other hand, the RMS surface roughness value for $SiO_2$ layers grown using similar PECVD process is reported to be between 3.6 to 4.0 nm (according to a study conducted by Amirzada, Muhammad Rizwan, et al. and published in the Applied Nanoscience journal, 2016, incorporated herein by reference in its entirety). These values of surface roughness have been corroborated by experiments as well, wherein similar roughness differences were observed between PECVD grown $SiO_2$ and $SiN_x$ layers. The smoother surface of the $SiN_x$ layer provides an ideal base upon which the second layer ($SiO_2$) can be deposited, ensuring a precise pattern transfer from the resist layer, and thus enhancing the overall quality and efficiency of the grating fabrication process.

DETAILED DESCRIPTION OF THE DRAWINGS

Referring to FIG. 1, illustrated is a flowchart listing steps 102-116 involved in a method 100 for fabricating high-aspect-ratio gratings, in accordance with an embodiment of the present disclosure. Further, referring to FIGS. 2A-2H, illustrated are simplified diagrammatic views of various resultant stages of the steps 102-116 of the method 100, in accordance with an embodiment of the present disclosure. Following description of embodiments is based on FIG. 1 and FIGS. 2A-2H in combination.

Figure 2A:
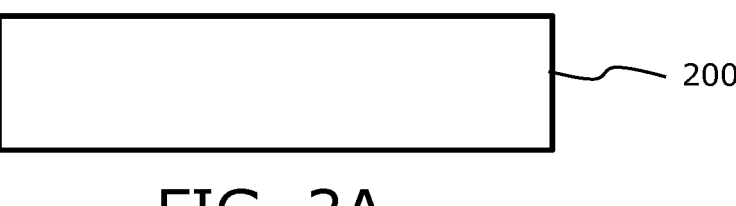
FIGS. 2A-2H are illustration of simplified diagrammatic views of various resultant stages of the steps of the method, in accordance with one or more embodiments of the present disclosure.
Figure 2B:
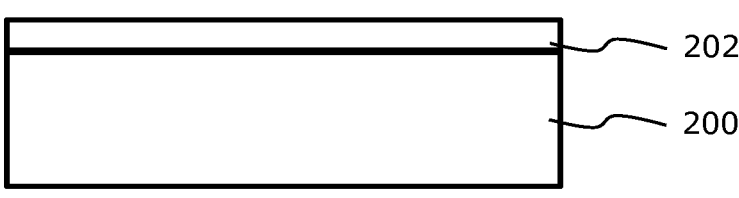
Figure 2C:
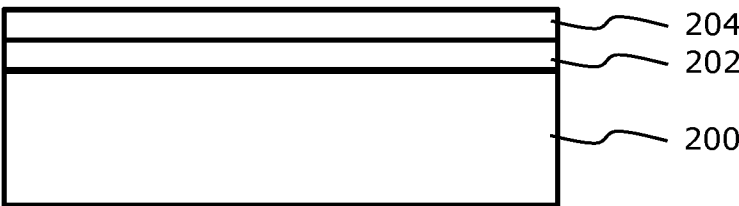
Figure 2D:
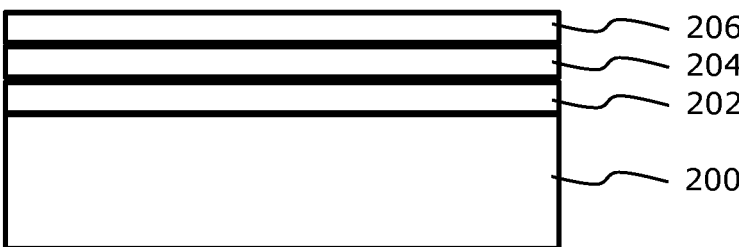
Figure 2E:
Figure 2F:
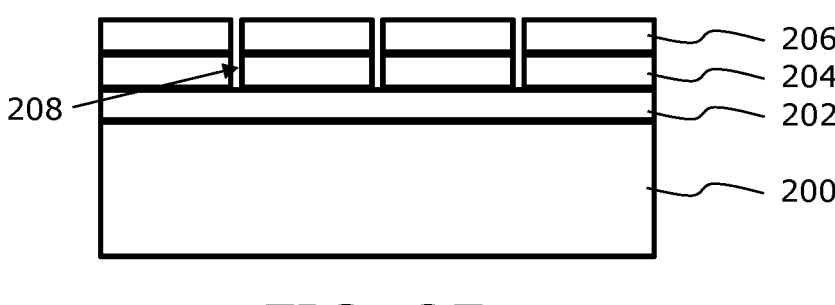
Figure 2G:
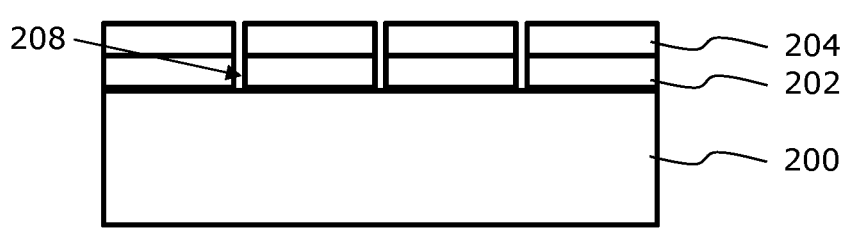
Figure 2H:
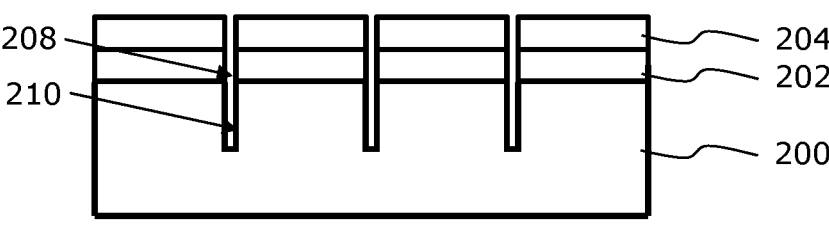

At step 102, the method 100 includes providing a semiconductor substrate 200 (as shown in FIG. 2A). At step 104, the method 100 includes depositing a first layer 202 (as shown in FIG. 2B) of a first silicon-based material on the semiconductor substrate 200. At step 106, the method 100 includes depositing a second layer 204 (as shown in FIG. 2C) of a second silicon-based material on the first layer 202. At step 108, the method 100 includes depositing a third layer 206 (as shown in FIG. 2D) of a resist material on the second layer 204. At step 110, the method 100 includes forming a pattern 208 (as shown in FIG. 2E) in the third layer 206 by exposing the resist material. At step 112, the method 100 includes transferring the pattern 208 from the third layer 206 into the second layer 204 by etching, as depicted in FIG. 2F. At step 114, the method 100 includes transferring the pattern 208 from the second layer 204 into the first layer 202 by etching, using the patterned second layer 204 as a first mask layer, as depicted in FIG. 2G. At step 116, the method 100 includes forming a grating 210 into the semiconductor substrate 200 by etching, using the patterned first layer 202 as a second mask layer, as depicted in FIG. 2H.

It may be appreciated that the above steps are only illustrative and other alternatives can also be provided where one or more steps are added, one or more steps are removed, or one or more steps are provided in a different sequence without departing from the spirit and the scope of the present disclosure.

Figure 3:
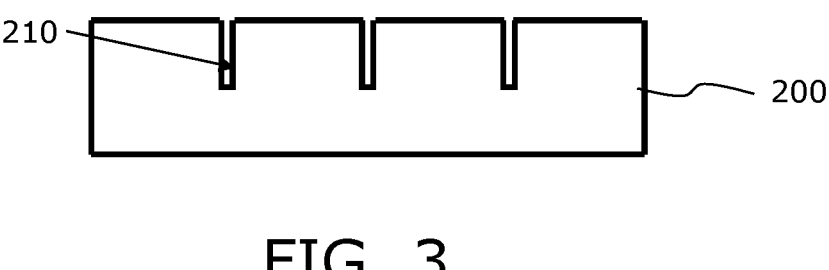
FIG. 3 is an illustration of a simplified diagrammatic view of a grating as formed in a semiconductor substrate, in accordance with one or more embodiments of the present disclosure.
Figure 4:
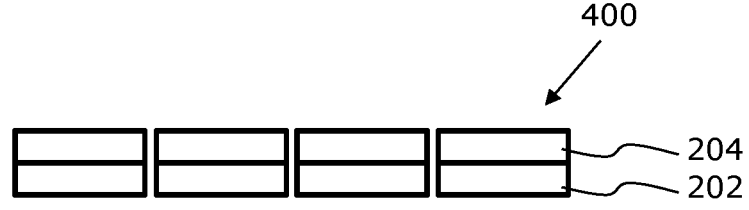
FIG. 4 is an illustration of a simplified diagrammatic view of a mask with a dual-layer structure including a first mask layer and a second mask layer, in accordance with one or more embodiments of the present disclosure.

Referring to FIG. 3, illustrated is a simplified diagrammatic view of the grating 210 as formed in the semiconductor substrate 200, in accordance with an embodiment of the present disclosure. Referring to FIG. 4, illustrated is a simplified diagrammatic view of a mask 400 with a dual-layer structure including the patterned second layer 204 as the first mask layer and the patterned first layer 202 as the second mask layer, in accordance with an embodiment of the present disclosure.

Figure 5:
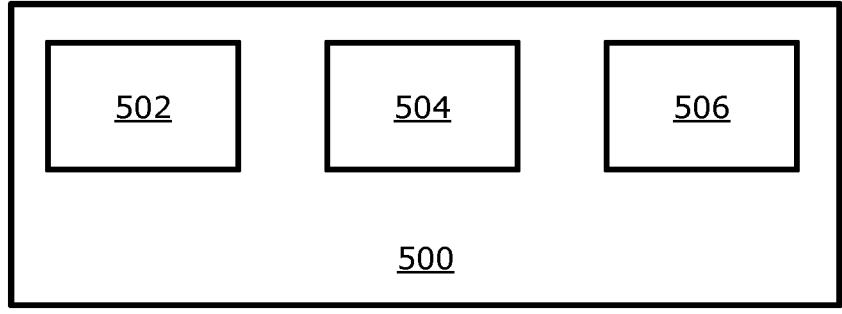
FIG. 5 is an illustration of a schematic block diagram of a system for fabricating high-aspect-ratio gratings, in accordance with one or more embodiments of the present disclosure.

Referring to FIG. 5, illustrated is a schematic block diagram of a system (as represented by reference numeral 500) for fabricating high-aspect-ratio gratings, in accordance with an embodiment of the present disclosure. The system 500 includes a deposition unit 502, a patterning unit 504 and an etching unit 506. The deposition unit 502 is configured to deposit the first layer of the first silicon-based material on the semiconductor substrate; deposit the second layer of the second silicon-based material on the first layer; and deposit the third layer of the resist material on the second layer. The patterning unit 504 is configured to form the pattern in the third layer by exposing the resist material. The etching unit 506 is configured to transfer the pattern from the third layer into the second layer by etching; transfer the pattern from the second layer into the first layer by etching, using the patterned second layer as a first mask layer; and form the grating into the semiconductor substrate by etching, using the patterned first layer as a second mask layer.

The invention claimed is:
1. A method for fabricating high-aspect-ratio gratings, the method comprising:
  providing a semiconductor substrate for use in optical components requiring wavelength selectivity;
  depositing a first layer of silicon nitride (SiNx) on the semiconductor substrate;
  depositing a second layer of silicon dioxide (SiO2) on the first layer;
  depositing a third layer of an electron beam resist material on the second layer;
  forming a pattern in the third layer by exposing the resist material;
  transferring the pattern from the third layer into the second layer by etching, wherein the etching involves

Reactive Ion Etching (RIE) using trifluoromethane (CHF$_3$) in conjunction with argon (Ar);

transferring the pattern from the second layer into the first layer by etching, using the patterned second layer as a first mask layer, wherein the etching involves RIE using trifluoromethane (CHF$_3$) in conjunction with oxygen (O$_2$); and forming a grating into the semiconductor substrate by etching, using the patterned first and second mask layers.

2. A method according to claim 1, wherein the semiconductor substrate is a silicon based material.

3. A method according to claim 1, wherein the resist material is an electron-beam resist material.

4. A method according to claim 1, wherein the first layer and the second layer are deposited using a Plasma Enhanced Chemical Vapor Deposition (PECVD) process.

5. A method according to claim 1, wherein forming a grating into the semiconductor substrate comprises etching a trench having a width of at least 20 nm.

6. A method according to claim 1, wherein forming a grating into the semiconductor substrate comprises etching a trench having a depth of at least 5 μm.

7. A method according to claim 1, wherein forming a grating into the semiconductor substrate comprises etching a trench having a depth of at least 1 μm.

8. A method according to claim 1, wherein the silicon nitride (SiN$_x$) of the first layer is provided to offer a smoother surface for subsequent layer deposition compared to silicon dioxide (SiO$_2$) deposited by the Plasma Enhanced Chemical Vapor Deposition (PECVD) process.

9. A method according to claim 1, comprising using Electron Beam Lithography (EBL) to expose the resist material.

10. A method for fabricating high-aspect-ratio gratings, said method comprising:

providing a semiconductor substrate comprising gallium arsenide (GaAs) for use in narrow wavelength semiconductor lasers;

depositing a first layer of a first silicon-based material on the GaAs semiconductor substrate;

depositing a second layer of a second silicon-based material on the first layer, wherein the first and second silicon-based materials are selected for high etch selectivity to GaAs and to one another;

depositing a third layer of an electron-beam resist material on the second layer;

forming a pattern in the third layer by exposing the resist material to achieve grating features with a width of at least 20 nm;

transferring the pattern from the third layer into the second layer by etching, wherein the etching involves Reactive Ion Etching (RIE) using trifluoromethane (CHF3) in conjunction with argon (Ar);

transferring the pattern from the second layer into the first layer by etching, using the patterned second layer as a first mask layer, wherein the etching involves RIE using trifluoromethane (CHF3) in conjunction with oxygen (O2); and forming a grating into the GaAs semiconductor substrate by etching, using the patterned first layer and second mask layers.

11. A method according to claim 10, wherein forming a grating into the semiconductor substrate comprises etching a trench having a width of at least 20 nm.

12. A method according to claim 10, wherein forming a grating into the semiconductor substrate comprises etching a trench having a depth of at least 5 μm.

13. A method according to claim 10, wherein forming a grating into the semiconductor substrate comprises etching a trench having a depth of at least 1 μm.

14. A method according to claim 10, wherein the silicon nitride (SiN$_x$) of the first layer is provided to offer a smoother surface for subsequent layer deposition compared to silicon dioxide (SiO$_2$) deposited by the Plasma Enhanced Chemical Vapor Deposition (PECVD) process.

15. A method according to claim 10, comprising using Electron Beam Lithography (EBL) to expose the resist material.

* * * * *